US008259466B2

(12) United States Patent
Bridges et al.

(10) Patent No.: US 8,259,466 B2
(45) Date of Patent: Sep. 4, 2012

(54) TOOL-LESS BACKPLANE RETENTION FOR COMPUTER HARDWARE

(75) Inventors: Jeremy S. Bridges, Apex, NC (US); Norman B. Desrosiers, Oxford, NC (US); Michael D. French, Raleigh, NC (US); Dean F. Herring, Youngsville, NC (US); Daniel P. Kelaher, Holly Springs, NC (US); John P. Scavuzzo, Cary, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 960 days.

(21) Appl. No.: 12/238,728

(22) Filed: Sep. 26, 2008

(65) Prior Publication Data

US 2010/0079936 A1 Apr. 1, 2010

(51) Int. Cl.
*H01R 12/16* (2006.01)
(52) U.S. Cl. .................... 361/788; 361/801; 361/802
(58) Field of Classification Search ............... 361/788, 361/796–802; 29/752–764
See application file for complete search history.

(56) References Cited

U.S. PATENT DOCUMENTS

| | | | | |
|---|---|---|---|---|
| 4,006,955 A | * | 2/1977 | Johnson | 439/327 |
| 5,046,237 A | * | 9/1991 | Conforti et al. | 29/764 |
| 5,265,328 A | * | 11/1993 | Gorman | 29/829 |
| 5,425,169 A | * | 6/1995 | Steinman et al. | 29/758 |
| 5,967,466 A | | 10/1999 | Osborne et al. | |
| 6,158,111 A | * | 12/2000 | Doye et al. | 29/739 |
| 6,179,642 B1 | * | 1/2001 | Hwang | 439/358 |
| 6,556,449 B2 | | 4/2003 | Rubenstein et al. | |
| 7,307,835 B1 | | 12/2007 | Barina et al. | |
| 7,312,999 B1 | | 12/2007 | Miyamura et al. | |
| 7,382,626 B2 | | 6/2008 | Dingfelder et al. | |
| 2007/0025095 A1 | | 2/2007 | Beall et al. | |
| 2007/0279884 A1 | | 12/2007 | Hardt et al. | |

* cited by examiner

*Primary Examiner* — Tuan T Dinh

(74) *Attorney, Agent, or Firm* — Cantor Colburn LLP; Thomas Tyson

(57) ABSTRACT

An apparatus is provided and includes a housing, including a housing mating device, through which an installation path for an assembly is defined with a space in which a first part is positioned, a backplane body having opposing faces on which a second part and a backplane mating device are respectively disposed, and a hub, in which a hub mating device is defined, and from which a two-stage mating device extends, the two-stage mating device including first and second elastically coupled stages. The hub and the backplane body are coupled to form the assembly and the assembly is installed/removed in/from the space with the second stage of the two-stage mating device elastically hooked by the housing mating device or released from the housing mating device and the first and second stages of the two-stage mating device biasing the hub and the backplane body to remain coupled.

17 Claims, 6 Drawing Sheets

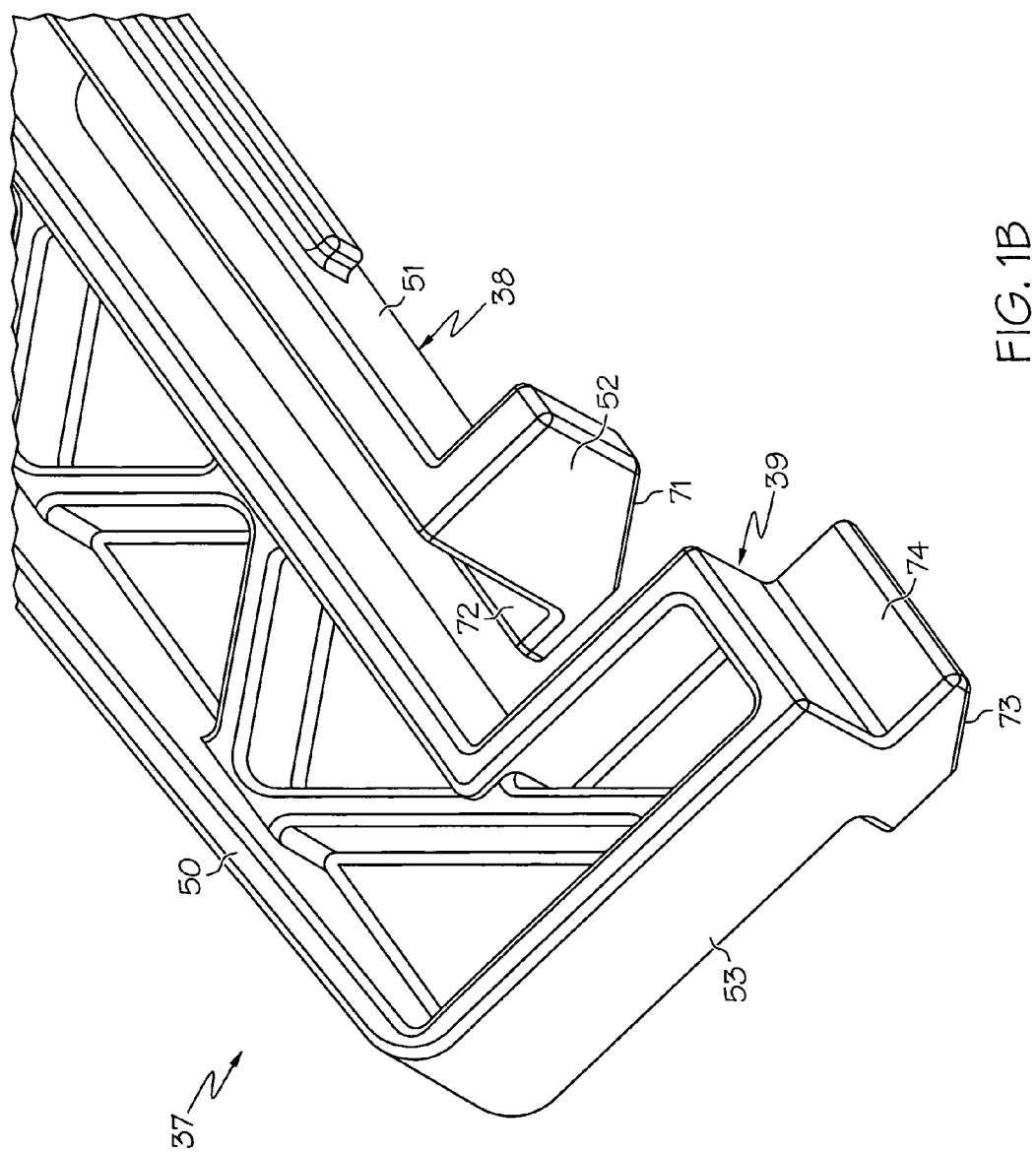

TOOL-LESS BACKPLANE RETENTION FOR COMPUTER HARDWARE

BACKGROUND

Aspects of the present invention are directed to a method and an apparatus to provide for tool-less backplane retention.

Generally, computers include hard disk drives, card assemblies and/or other similar electronic components that are installed within respective installation outlets within the computer hardware. These hard disk drives and card assemblies are typically formed of internal components, such as electronic devices, and external structures that give the hard disk drives and card assemblies their respective forms and through which the internal components communicate with the computers into which they are installed.

It has been seen that the external structures of the hard disk drives and the card assemblies are usually formed of substructures that are not easily manipulated and serviced. In fact, specialized tools and knowledge are almost always necessary for even basic repairs. Unfortunately, it has been seen that servicing of external structures of hard disk drives and card assemblies is frequently required and, as a result, the specialized tools and knowledge for repairs are also frequently required and, very often, not available.

SUMMARY

In accordance with an aspect of the invention, an apparatus is provided and includes a housing, including a housing mating device, through which an installation path for an assembly is defined with a space in which a first part is positioned, a backplane body having opposing faces on which a second part and a backplane mating device are respectively disposed, and a hub, in which a hub mating device is defined, and from which a two-stage mating device extends, the two-stage mating device including first and second elastically coupled stages, wherein the hub and the backplane body are coupled to form the assembly with the hub mating device receptive of the backplane mating device and the first stage of the two-stage mating device elastically hooked onto the backplane body, and, the assembly is installed in and removed from the space with the second stage of the two-stage mating device elastically hooked by the housing mating device and the first and second parts abutting one another, or with the second stage of the two-stage mating device released from the housing mating device and the first and second stages of the two-stage mating device biasing the hub and the backplane body to remain coupled.

In accordance with another aspect of the invention, a handle apparatus to provide for tool-less backplane retention of an assembly for insertion into a housing is provided and includes a hub, a hub mating device defined within a central portion of the hub, and a two-stage mating device, including first and second elastically coupled stages, extending from the hub, the first stage being cooperatively paired with the hub mating device to couple the hub to a backplane mating device and a backplane body, respectively, to form the assembly and the second stage being configured to engage a housing mating device during the insertion of the assembly into the housing to retain the assembly therein, wherein the coupling of the first and second stages biases the hub to remain coupled to the backplane body in response to forces on the hub directed toward and/or away from the backplane body.

In accordance with another aspect of the invention, a method of forming an assembly, providing tool-less backplane retention, for insertion thereof into a housing is provided and includes coupling a hub and a backplane body by inserting a backplane mating device, which protrudes from a face of the backplane body, through a hub mating device, which is defined in the hub, and, during a near-completion of the insertion of the backplane mating device through the hub mating device, forcing a first stage of a two-stage mating device, which extends from the hub, to elastically hook onto the backplane body.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

FIG. 1B is an enlarged perspective view of a portion of an exemplary two-stage mating device according to embodiments of the invention;

DETAILED DESCRIPTION

Figure 1A:
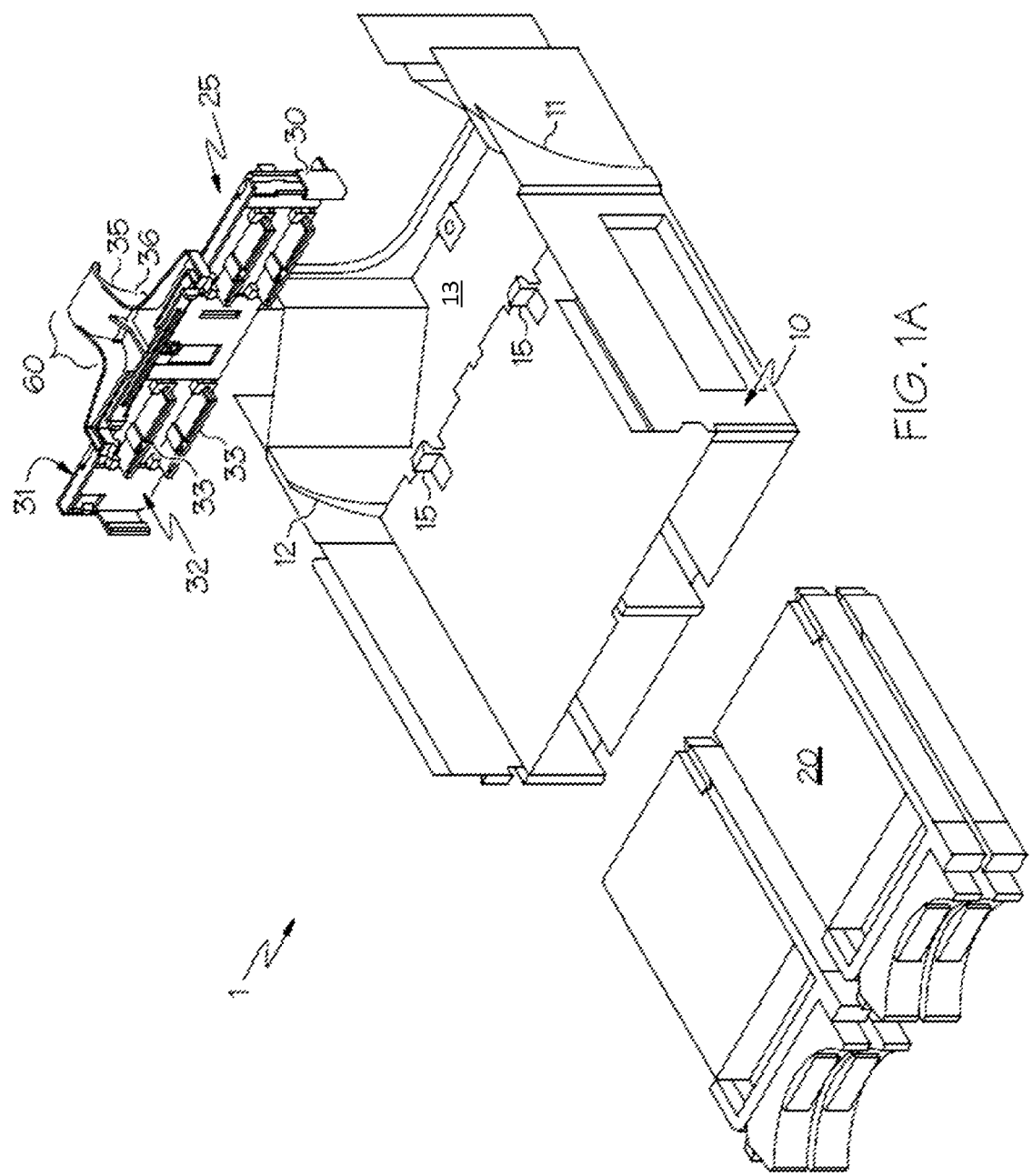
FIG. 1A is a perspective view of components of an exemplary apparatus according to embodiments of the invention.
Figure 2:
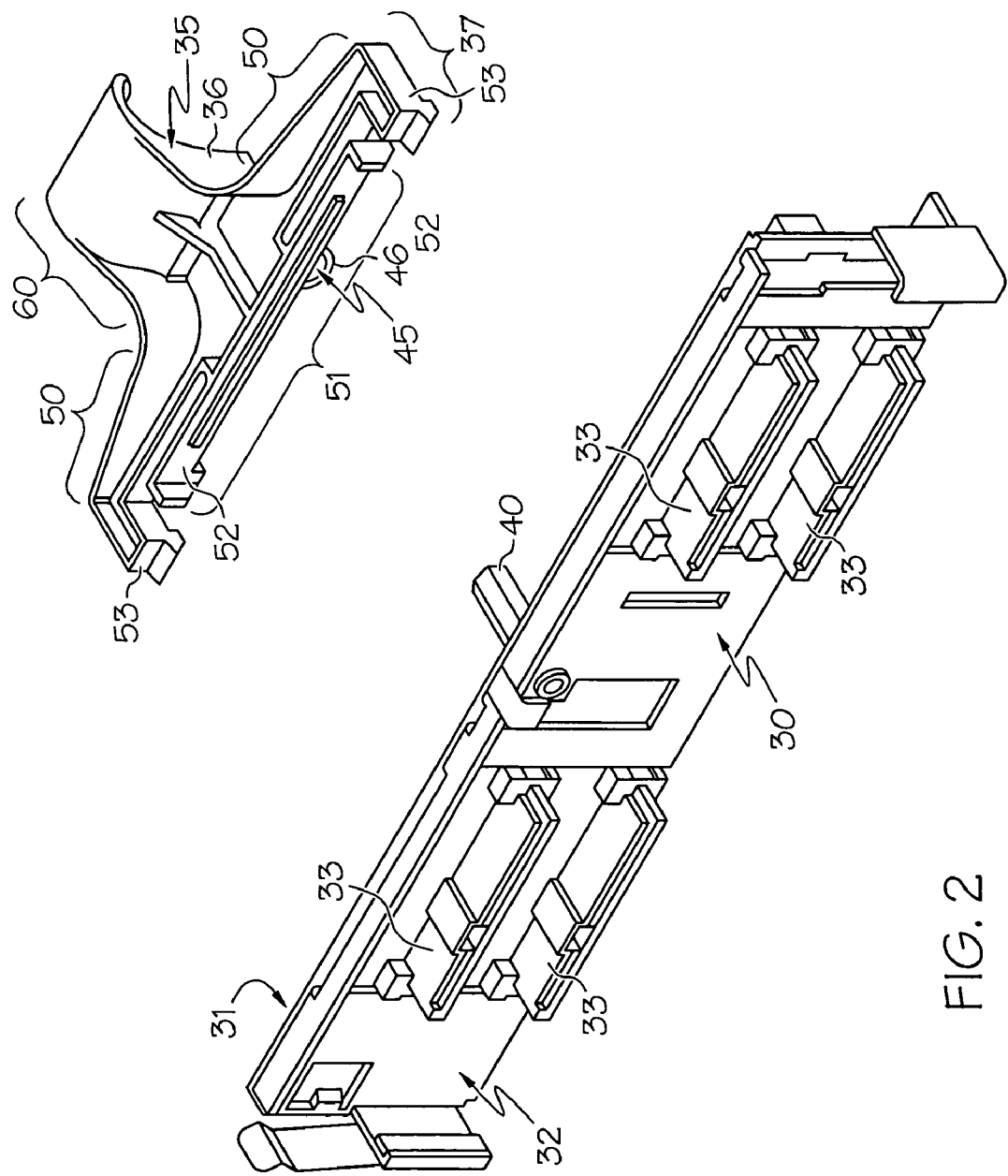
FIG. 2 is a perspective view of a disassembled exemplary assembly according to embodiments of the invention.
Figure 3A:
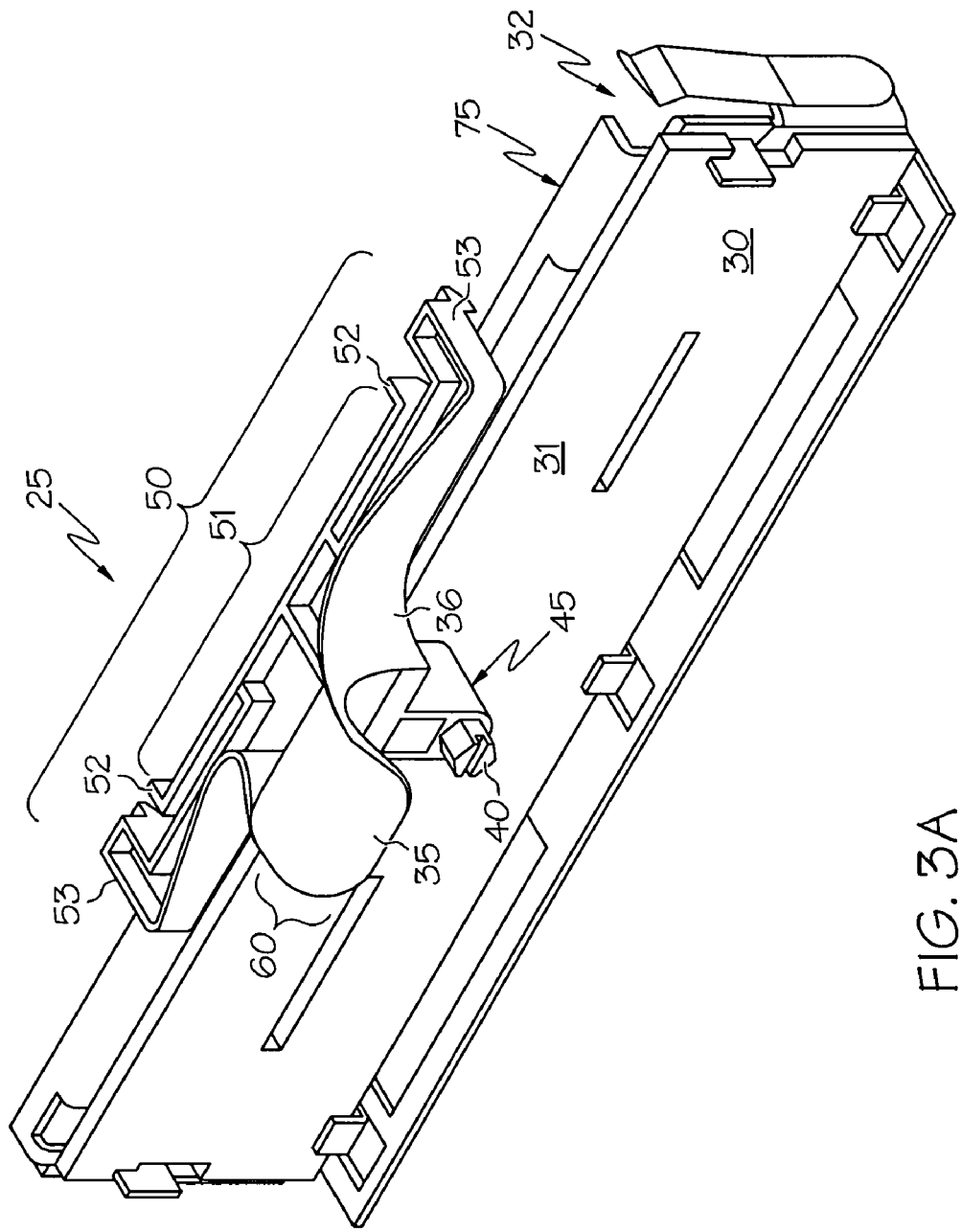
FIGS. 3A and 3B are isometric views of the exemplary assembly of FIG. 2.
Figure 3B:
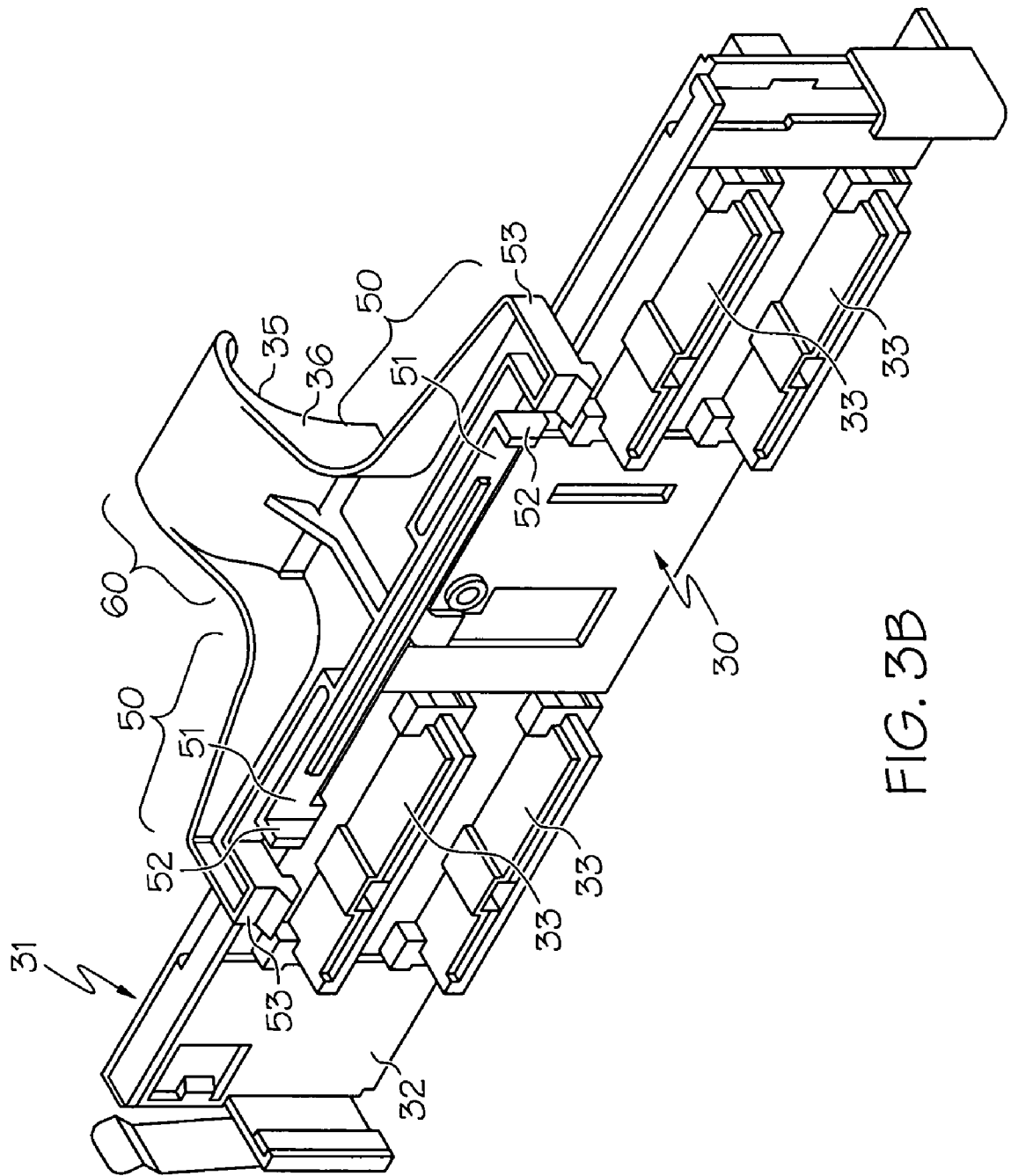

With reference to FIGS. 1-4, an apparatus 1 provides for tool-less backplane retention for use in various hardware applications, including, e.g., a hard disk drive (HDD) or a card assembly or some other similar component. The apparatus 1 allows for tool-less service, assembly and disassembly thereof, provides for a lift-point for the disassembly thereof, can be implemented across multiple systems.

The apparatus 1 includes a housing 10 that incorporates external structures of, e.g., a hard disk drive, a card assembly and/or other similar components. In that capacity, the housing 10 includes a housing mating device 15 and has an installation path 11 defined therein. An assembly 25 (to be discussed below) is installed into the housing 10 by being inserted therein along the installation path 11. The installation path 11 has a space 13 (e.g., an installation space having a size and shape that generally corresponds to that of the assembly 25) in which a first part 20 is positioned. The first part 20 may include a connector for a hard disk, a memory card or a similar electronic component.

In accordance with embodiments of the invention, the housing mating device 15 may include a tab disposed near an entrance to the installation path 11 and/or proximate the space 13. The housing mating device 15 may be attached to the housing 10 by way of a fastener or may be integrally built into the housing 10. In addition, the housing mating device may be formed of materials which elastically respond to the application of external forces.

The installation path 11 follows a generally inwardly directed curving pathway that extends into the interior of the housing 10. The space 13 is defined along the installation path 11 and, in an embodiment of the invention, at an end of the installation path 11. One or more guides 12 may be provided along the installation path 11 to facilitate installations of the assembly 25 or other similar components into the space 13.

The apparatus further includes a backplane body 30. The backplane body 30 may be optionally formed of, at least, sheet metal and includes first and second opposing faces 31 and 32 which are substantially flat and may be rectangular or otherwise shaped in correspondence with a shape of the space 13. A backplane mating device 40 is disposed on and protrudes from the first face 31. A second part 33 is disposed on the second face 32. The second part 33 is configured to be coupled to and in signal communication with the first part 20 of the housing 10 when the assembly 25 is installed therein.

In accordance with embodiments of the invention, the backplane mating device 40 may include an extended member, such as a post, which is integrally connected to or otherwise attached to the first face 31. The backplane mating device 40 may extend away from the first face 31 in a substantially normal direction with respect to a plane of the first face 31. A length of the backplane mating device 40 may be varied but should not exceed a distance between the first face 31 and a sidewall of the housing 10 when the assembly 25 is installed in the housing 10.

A handle 35 is configured to be coupled to the backplane body 30 to thereby form the assembly 25 which is to be inserted into the space 13 of the housing 10. The handle 35 includes a hub 36 which generally comprises a solid rigid bulkhead. A hub mating device 45 is defined in a central portion of the hub 36. A two-stage mating device 37, which includes a first stage thereof 38 and a second stage thereof 39, and a manipulating portion 60 each extend in substantially transverse directions from upper portions of the hub 36.

The manipulating portion 60 may include a curved flange that extends away from the hub 36 in a direction that mimics the curvature of the installation path 11. With this configuration, the manipulating portion 60 allows an operator of the handle 35 to maintain control of the assembly 25 during the installation thereof into the housing 10. Of course, it is understood that the shape of the curved flange of the manipulating portion 60 is, in fact, independent of and need not mimic the curvature of the installation path 11. In addition, in accordance with embodiments of the invention, the extension direction of the manipulating portion 60 away from the hub 36 may be transverse to the direction by which the two-stage mating device 37 extends away from the hub 36. In accordance with further embodiments of the invention, the hub 36, the two-stage mating device 37 and the manipulating portion 60 may be provided substantially symmetrically about a center-line of the handle 35.

Where the backplane mating device 40 includes an extended member protruding from the first face 31, the hub mating device 45 includes a portion of the hub 36 in which a through-hole 46 is defined. Here, as the hub 35 is brought toward the backplane body 30, the through-hole 46 of the hub mating device 45 receives the backplane mating device 40 in a sliding engagement. This sliding engagement continues as the hub 35 is continually brought toward the backplane body 30 until a first stage 38 of the two-stage mating device 37 contacts an edge of the backplane body 30. It is noted that, while the hub mating device 45 and the backplane mating device 40 are described as female and male mating devices, respectively, embodiments of the invention exist in which the opposite arrangement is provided.

In accordance with embodiments of the invention, the first and second stages 38 and 39 of the two-stage mating device 37 include spring arm 51 and rigid arm 50, respectively. Each of the rigid arm 50 and the spring arm 51 further includes first and second distal mating portions 52 and 53, respectively. The rigid arm 50 and the spring arm 51 may be integrally coupled to one another and to the hub 36 and respectively formed of rigid and elastic materials. As such, the rigid arm 50 and the spring arm 51 are effectively elastically coupled to one another, with the rigid arm 50 providing stability, and to the hub 36 proximate to respective midpoints thereof such that the rigid arm 50 and the spring arm 51 are substantially symmetrically disposed with respect to the hub 36. Here, the housing mating device 15 includes two housing mating devices 15 which are disposed on the housing 10 at locations corresponding to the locations of the first and second distal mating portions 53 of the rigid arm 50 of the second stage 39.

The first and second distal mating portions 52 of the spring arm 51 of the first stage 38 may include a forward contacting surface 71 that comes into contact with an overhanging flange 75, which is located at the edge of the backplane body 30, as the hub 36 is brought into contact with the backplane body 30. As the hub 36 and the backplane body 30 continue to approach one another, the flange 75 causes the spring arm 51 to elastically deform until the flange 75 clears the forward contacting surface 71. At this point, the elasticity of the spring arm 51 causes the distal portion 52 to spring past the flange 75 and into position such that the locking surface 72 abuts an underside of the flange 75. Here, the engagement of the hub mounting device 45 with the backplane mating device 40 and the engagement of the first stage 38 of the two-stage mating device 37 and the flange 78 of the backplane body 30 cooperatively couple the hub 36 to the backplane body 30 to thereby form the assembly 25.

Conversely, as the assembly 25 is installed within the space 13 of the housing 10, a forward contacting surface 73 of the first and second distal mating portions 53 of the rigid arm 50 of the second stage 39 comes into contact with a flange 16 of the housing mating device 15. As the installation of the assembly 25 proceeds, the flange 16 and the rigidity of the rigid arm 50 cooperatively cause the spring arm 51 to elastically deform until the flange 16 clears the forward contacting surface 73. At this point, the elasticity of the spring arm 51 allows for a procession of the distal portion 53 past the flange 16 and into position such that the locking surface 74 abuts an underside of the flange 16.

During the installation of the assembly 25 into the housing 10, the elastic deformation of the spring arm 51 by the rigid arm 50 and the flange 16 increases the biasing of the spring arm 51 toward the backplane body 30. That is, due to the coupling of the rigid arm 50 and the spring arm 51, the force applied to the distal portion 53 by the flange 16 is transmitted by the rigid arm 50 to the spring arm 51. This transmitted force causes the spring arm 51 to bias the first stage 38 of the two-stage mating device 37 against the backplane body 30 in the direction of the hub 36.

Figure 4:
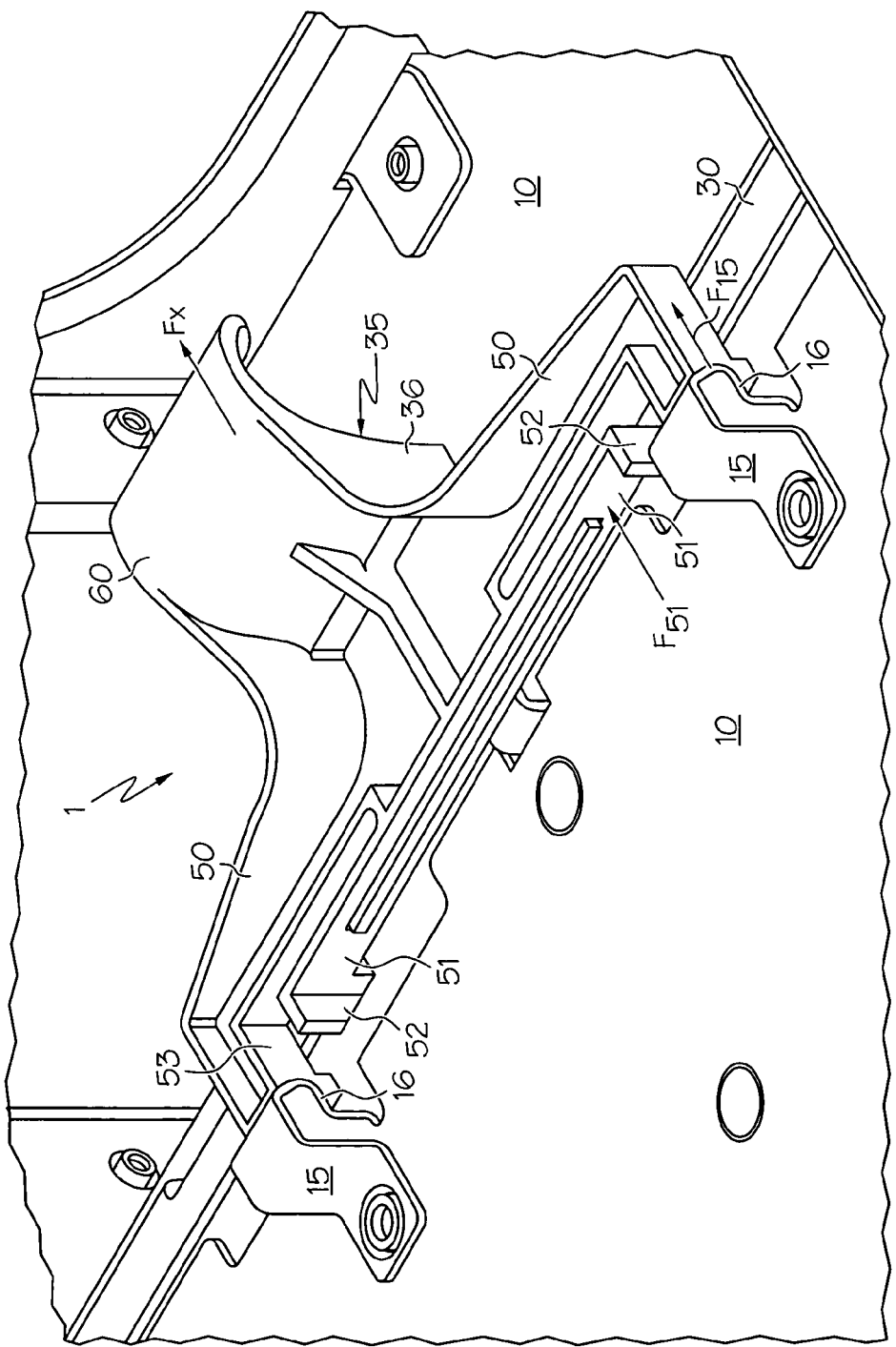
FIG. 4 is an enlarged perspective view of components of an exemplary apparatus according to embodiments of the invention.

In greater detail, with the assembly 25 formed as discussed herein, the coupling of the first and second stages 38 and 39 of the two-stage mating device 37 to one another and to the hub 36 provide for a biasing of the hub 36 and the backplane body 30 to remain coupled to one another generally and in response to a force on the hub 36, which is directed toward/away from the backplane body 30. As shown in FIG. 4, a force $F_x$ is exerted onto the manipulating portion 60 in a direction pointing away from the hub 36. As a result, the integral coupling of the hub 36 to the first spring arm 51 generates a companion force $F_{51}$ that biases the backplane body 30 toward the hub 36. In a similar fashion, where a force $F_{15}$ is exerted onto the distal mating portion 53 of the rigid arm 50 of the second stage 39, the integral coupling of the rigid arm 50 and the spring arm 51 also provides for the generation of the companion force $F_{51}$.

In accordance with another aspect of the invention, a handle apparatus 1 to provide for tool-less backplane retention of an assembly 25 for insertion into a housing 10 is provided. The handle apparatus includes a hub 36, a hub mating device 45 defined within a central portion of the hub 36, and a two-stage mating device 37. The two-stage mating device 37, as discussed above, includes first and second elastically coupled stages 38 and 39, extending from the hub 36. The first stage 38 is cooperatively paired with the hub mating device 45 to couple the hub 36 to a backplane mating device 40 and a backplane body 30, respectively, to form the assembly 25. The second stage 39 is configured to engage a housing mating device 15 during the insertion of the assembly 25 into the housing 10 to retain the assembly 25 therein. Here, the coupling of the first and second stages 38 and 39 biases the hub 36 to remain coupled to the backplane body 30 in response to forces on the hub 36 directed toward and/or away from the backplane body 30.

In accordance with another aspect of the invention, a method of forming an assembly, providing for tool-less backplane retention, for insertion thereof into a housing, is provided and includes coupling a hub and a backplane body by inserting a backplane mating device, which protrudes from a face of the backplane body, through a hub mating device, which is defined in the hub, and, during a near-completion of the insertion of the backplane mating device through the hub mating device, forcing a first stage of a two-stage mating device, which extends from the hub, to elastically hook onto the backplane body.

The method may further include installing or removing the assembly in or from the housing. In addition, the installing and the removing each generate forces on a second stage of the two-stage mating device, which is elastically coupled to the first stage, such that the hub is biased to remain coupled to the backplane body.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An apparatus comprising:
    a housing, including a housing mating device, through which an installation path for an assembly is defined with a space in which a first part is positioned;
    a backplane body having opposing faces on which a second part and a backplane mating device are respectively disposed; and
    a hub, in which a hub mating device is defined, and from which a two-stage mating device extends, the two-stage mating device including first and second elastically coupled stages, wherein:
        the hub and the backplane body are coupled to form the assembly with the hub mating device receptive of the backplane mating device and the first stage of the two-stage mating device elastically hooked onto the backplane body, and,
        the assembly is installed in and removed from the space with the second stage of the two-stage mating device elastically hooked by the housing mating device and the first and second parts abutting one another, or with the second stage of the two-stage mating device released from the housing mating device and the first and second stages of the two-stage mating device biasing the hub and the backplane body to remain coupled.

2. The apparatus according to claim 1, wherein the first and second parts electronically communicate with one another when the first and second parts abut one another.

3. The apparatus according to claim 1, wherein the backplane mating device comprises an extended member protruding from the corresponding face of the backplane body.

4. The apparatus according to claim 3, wherein the hub mating device is defined with a through-hole to receive the extended member.

5. The apparatus according to claim 1, further comprising a manipulating portion, which is integrally connected to the hub and by which the hub is manipulated by an operator.

6. The apparatus according to claim 1, wherein the first and second stages of the two-stage mating device respectively comprise a spring arm and a rigid arm, each of which has respective first and second distal mating portions, which are coupled to one another and to the hub proximate respective midpoints thereof.

7. The apparatus according to claim 6, wherein the spring arm and the rigid arm and the distal mating portions of each are symmetric with respect to the hub.

8. The apparatus according to claim 6, wherein the housing mating device comprises first and second housing mating portions corresponding to the first and second distal mating portions of the second stage.

9. The apparatus according to claim 6, wherein the coupling of the spring arm and the rigid arm biases the hub to remain coupled to the backplane body in response to a force on the hub, which is directed toward/away from the backplane body.

10. A handle apparatus to provide for tool-less backplane retention of an assembly for insertion into a housing, the handle apparatus comprising:
    a hub;
    a hub mating device defined within a central portion of the hub; and
    a two-stage mating device, including first and second elastically coupled stages, extending from the hub, the first stage being cooperatively paired with the hub mating device to couple the hub to a backplane mating device and a backplane body, respectively, to form the assembly and the second stage being configured to engage a housing mating device during the insertion of the assembly into the housing to retain the assembly therein, wherein:
        the coupling of the first and second stages biases the hub to remain coupled to the backplane body in response to forces on the hub directed toward and/or away from the backplane body.

11. The handle apparatus according to claim 10, wherein the backplane mating device comprises an extended member protruding from a corresponding face of the backplane body.

12. The handle apparatus according to claim 11, wherein the hub mating device is defined with a through-hole to receive the extended member.

13. The handle apparatus according to claim 10, further comprising a manipulating portion, which is integrally connected to the hub and by which the hub is manipulated by an operator.

14. The handle apparatus according to claim 10, wherein each of the first and second stages of the two-stage mating device respectively comprise a spring arm and a rigid arm, each of which has respective first and second distal mating portions, which are coupled to one another and to the hub proximate to respective midpoints thereof.

15. The handle apparatus according to claim 14, wherein the spring arm and the rigid arm and the distal mating portions of each are symmetric with respect to the hub.

16. The handle apparatus according to claim 14, wherein the housing mating device comprises first and second housing mating portions corresponding to the first and second distal mating portions of the second stage.

17. The handle apparatus according to claim 14, wherein the coupling of the spring arm and the rigid arm biases the hub to remain coupled to the backplane body in response to a force on the hub, which is directed toward and/or away from the backplane body.

* * * * *